(12) United States Patent
Liu

(10) Patent No.: US 10,271,445 B2
(45) Date of Patent: Apr. 23, 2019

(54) CASING OF ELECTRONIC DEVICE

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Cheng-Xiang Liu, Shenzhen, CA (US)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/817,046

(22) Filed: Nov. 17, 2017

(65) Prior Publication Data
US 2019/0045647 A1    Feb. 7, 2019

(30) Foreign Application Priority Data

Aug. 3, 2017 (CN) .......................... 2017 1 0657478

(51) Int. Cl.
*H05K 5/02* (2006.01)
(52) U.S. Cl.
CPC .................................. *H05K 5/0243* (2013.01)
(58) Field of Classification Search
CPC .... H05K 5/0243; H04B 1/3888; B01D 69/00; B01J 13/04; B22F 1/0051; B22F 9/082; C03B 19/1075; C03B 37/022; B06B 1/0655; A45C 2011/001; A45C 2011/002; A45C 2011/003; A45C 13/02; B63B 3/13
See application file for complete search history.

(56) References Cited

U.S. PATENT DOCUMENTS

2017/0194997 A1* 7/2017 Tu ........................ H04B 1/3888

OTHER PUBLICATIONS

3D Printing a 3D Honeycomb Infill concept, EngineerDog, 2015 https://engineerdog.com/2015/03/08/3d-printing-a-3d-honeycomb-infill-concept/.*
A Hollow Octahedron Made of Rhombic Dodecahedra, RobertLovesPi. net, 2014 https://robertlovespi.net/2014/09/19/a-hollow-octahedron-made-of-rhombic-dodecahedra-with-variations/ (Year: 2014).*

* cited by examiner

*Primary Examiner* — Jianxun Yang
(74) *Attorney, Agent, or Firm* — ScienBiziP, P.C.

(57) ABSTRACT

A casing of an electronic device includes a shell composed of a number of unit bodies arranged in a number of unit body layers. Each of the unit bodies is a hollow structure including a main portion and two end portions. The two end portions are located at opposite ends of the main portion. The main portion is a hollow hexagonal column. Each of the end portions includes three rhomboid faces extending from the main portion and forming a tip. The unit body layers are arranged such that the tips are staggered.

5 Claims, 5 Drawing Sheets

CASING OF ELECTRONIC DEVICE

CROSS-REFERENCE TO RELATED APPLICATIONS

This application claims priority to Chinese Patent Application No. 201710657478.5 filed on Aug. 3, 2017, the contents of which are incorporated by reference herein.

FIELD

The subject matter herein generally relates to casings, and more particularly to a casing of an electronic device having a reduced weight and increased structural integrity.

BACKGROUND

Generally, casings of electronic devices are made of metal, glass, or other hard material. The casing is generally made of a solid piece.

BRIEF DESCRIPTION OF THE DRAWINGS

Implementations of the present disclosure will now be described, by way of example only, with reference to the attached figures.

DETAILED DESCRIPTION

Figure 1:
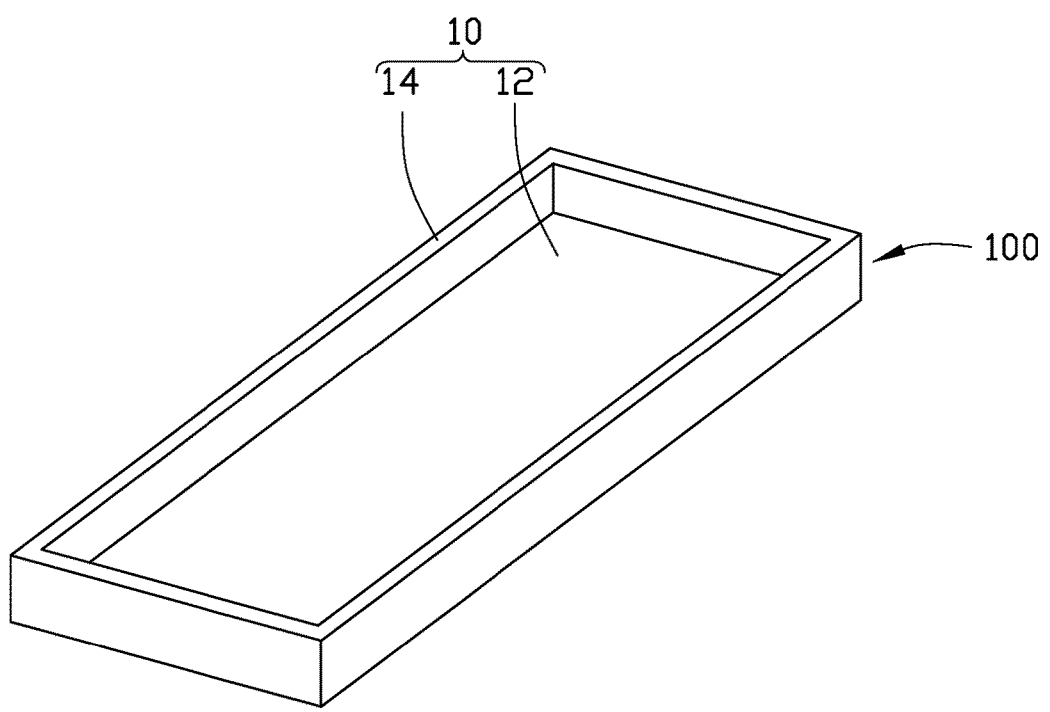
FIG. 1 is an isometric view of an exemplary embodiment of a casing of an electronic device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 2:
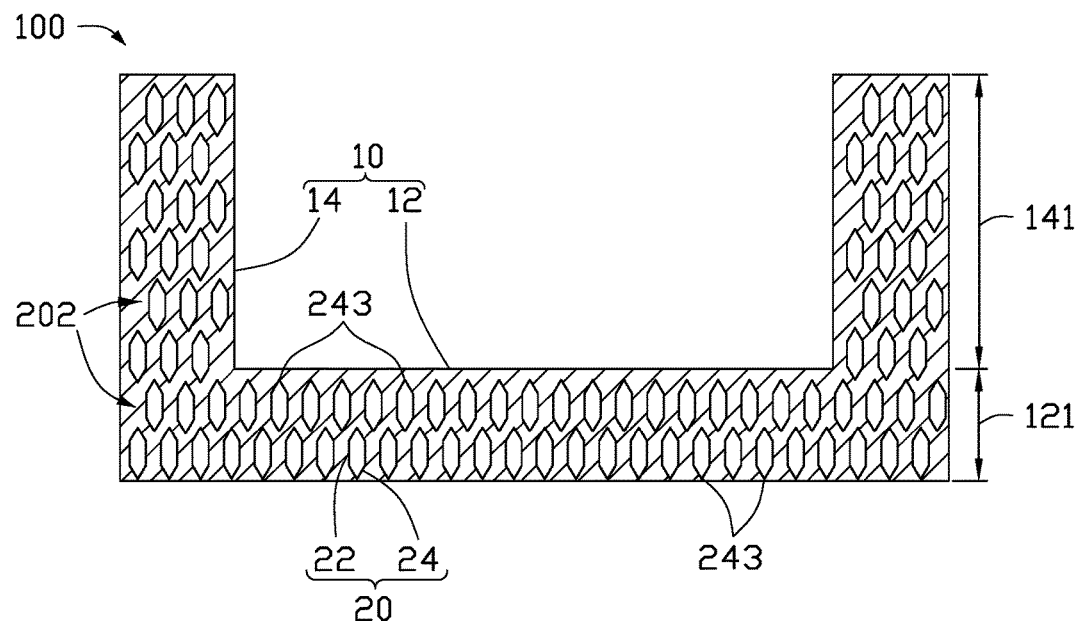
FIG. 2 is a first cross-sectional view of the casing of FIG. 1.

Referring to FIG. 1 and FIG. 2, an exemplary embodiment of a casing 100 of an electronic device is shown. In at least one embodiment, the casing 100 can be a casing of a mobile phone. The casing 100 can include a shell 10 composed of a plurality of unit bodies 20 arranged in a plurality of unit body layers 202. The unit body 20 can be substantially hollow and include a main portion 22 and two end portions 24. The two end portions 24 can be located at opposite ends of the main portion 22. The main portion 22 can be a hollow hexagonal column. The end portion 24 can include three rhomboid faces 241 each extending from the main portion 22 and forming a tip 243. The unit bodies 20 in the unit body layers 202 can be arranged in a staggered configuration. In at least one embodiment, the unit bodies 20 in the unit body layers 202 are arranged in a honeycomb pattern.

Figure 3:
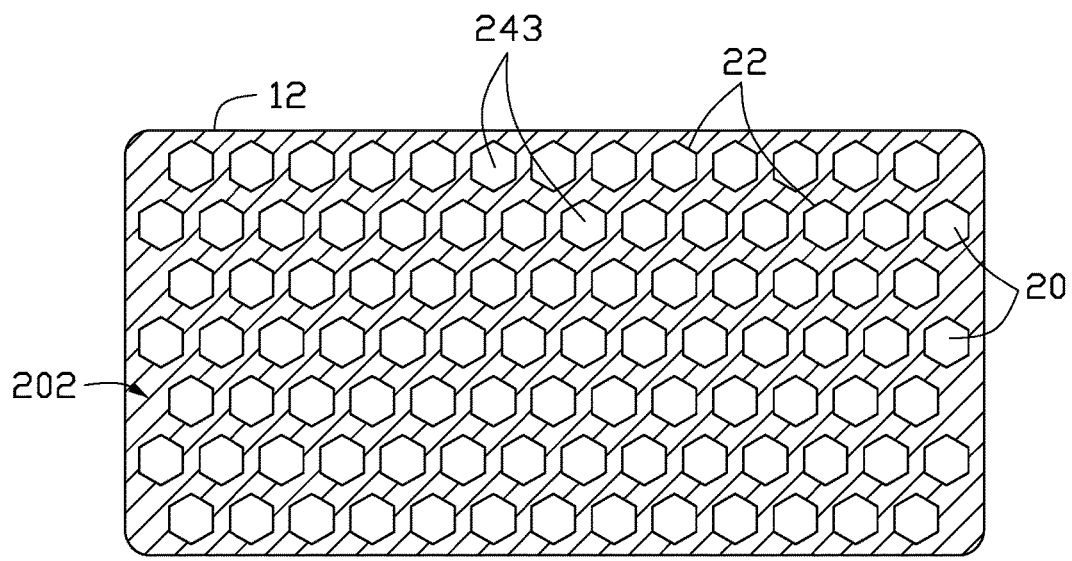
FIG. 3 is a second cross-sectional view of FIG. 1.

In at least one embodiment, an interior of the shell 10 can have phone components arranged therein, and a screen of the phone (not shown) can be arranged on the shell 10. The shell 10 can include a bottom plate 12 and a side plate 14. The side plate 14 is arranged around a periphery of the bottom plate 12. The bottom plate 12 has a thickness 121, and the side plate 14 has a thickness 141. The bottom plate 12 and the side plate 14 are both composed of the plurality of unit bodies 20. Each unit body layer 202 includes a plurality of unit bodies 20, and the main portions 22 of the unit bodies 20 are arranged in a honeycomb structure (as shown in FIG. 3). The unit body layers 202 can be layered such that the tips 243 of adjacent layers are staggered. Thus, the arrangement of the unit body layers 202 can reduce an overall weight of the phone.

Figure 4:
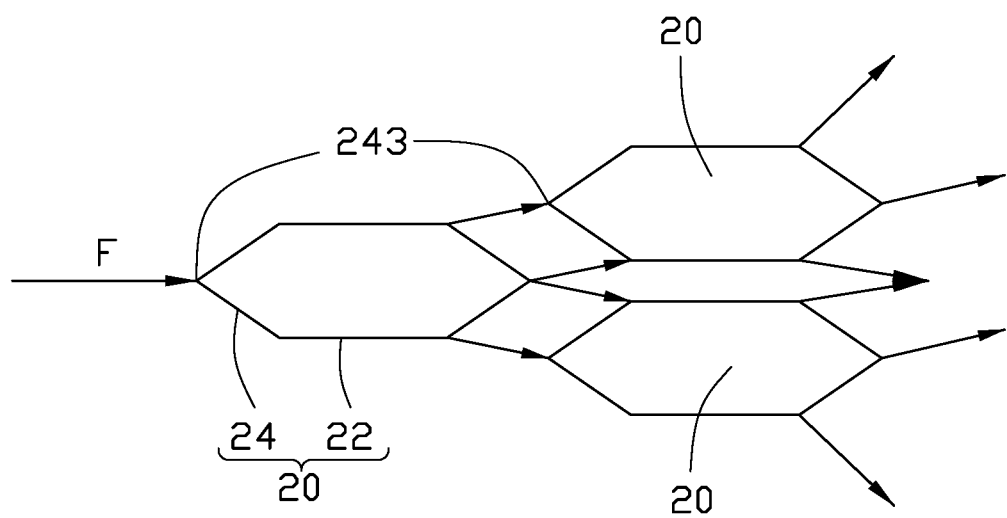
FIG. 4 is a diagram of an arrangement of a plurality of unit bodies of the casing.

FIG. 4 illustrates an alignment of the tips 243 of the unit bodies 20 of adjacent unit body layers 202. In FIG. 4, the unit bodies 20 of the unit body layers 202 are arranged in a staggered configuration such that the tips 243 of one unit body layer 202 are staggered across adjacent unit body layers 202. In other words, the tips 243 of one unit body layer 202 are aligned with tips 243 of every other unit body layer 202 across an adjacent unit body layer 202 (shown in FIG. 2). In at least one embodiment, the tips 243 are arranged substantially perpendicularly to the bottom plate 12. When an external force F impacts on the shell 10, the external force F can be transmitted among the plurality of unit bodies through the tips 243 and dissipated. Thus, a strength of the shell 10 is improved.

In at least one embodiment, the unit body layers 202 can be formed by 3D printing. The unit bodies 20 of the unit body layers 202 can all be formed having a same size. The 3D printer can continuously print the unit bodies 20 having the same size, the bottom plate 12 having the thickness 121, and the side plate 14 having the thickness 141. In this way, the shell 10 can have the unit bodies 20 arranged in staggered layers with the tips 243 staggered across adjacent unit body layers 202 to reduce a weight and increase a strength of the shell 10.

Figure 5:
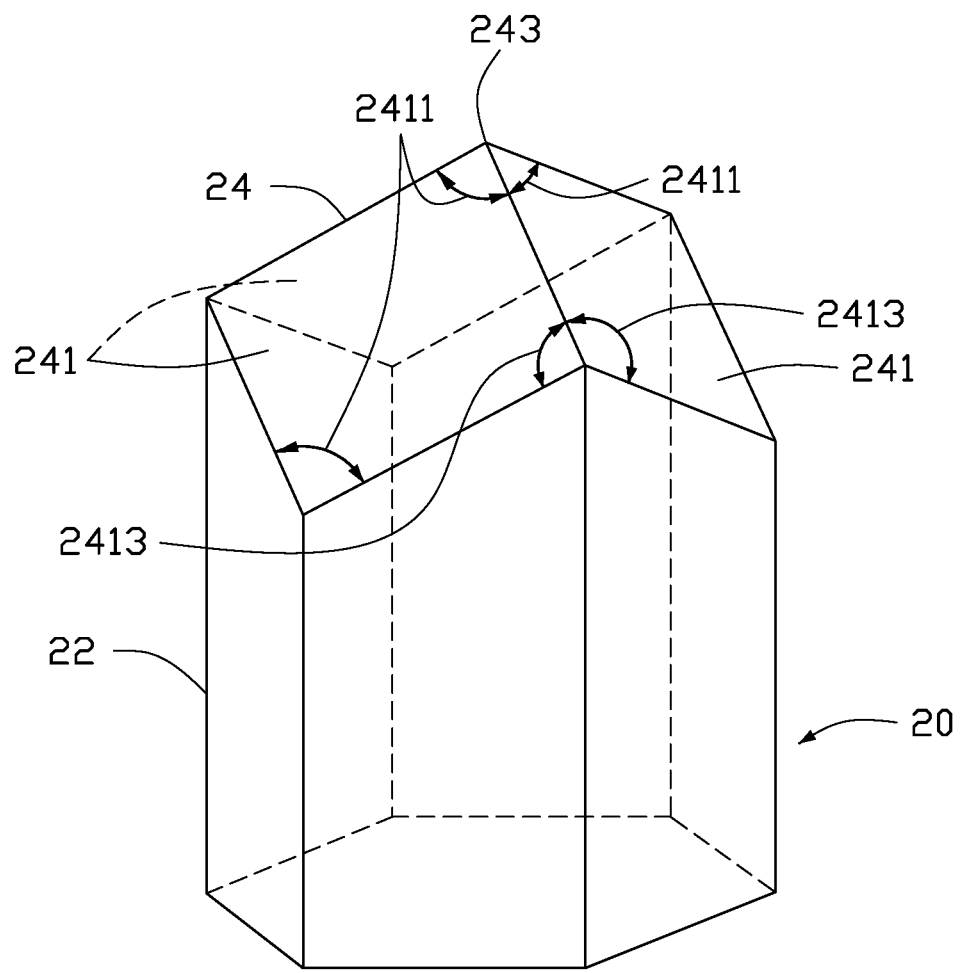
FIG. 5 is a diagram of the unit body of FIG. 4.

Referring to FIG. 5, the rhomboid faces 241 of each end portion 24 are identical and each rhomboid face 241 includes two opposite corners having obtuse angles 2411 and two opposite corners having acute angles 2413. The two opposite corners having the acute angles 2413 are joined to the corresponding adjacent rhomboid faces 241. The tip 243 is formed by the corresponding corners having the obtuse angles 2411. The rhomboid faces 241 are coupled to the main portion 22 by the corresponding corners having the obtuse angles 2411. The two opposite corners having the acute angles 2413 can have the same angle, and the two opposite corners having the obtuse angles 2411 can have the same angle. The obtuse angle can be between 108 and 110 degrees, and the acute angle can be between 70 and 72 degrees.

The shell 10 having the arrangement of the unit bodies 20 with the tips 243 as described above can reduce a weight and improve structural integrity of the casing 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A casing of an electronic device comprising a shell composed of a plurality of unit bodies arranged in a plurality of unit body layers; wherein:
    each of the plurality of unit bodies is a hollow structure and comprises a main portion and two end portions;
    the two end portions are located at opposite ends of the main portion;
    the main portion is a hollow hexagonal column;
    each of the end portions comprises three rhomboid faces extending from the main portion and forming a tip; wherein the three rhomboid faces of the end portions are identical; each of the rhomboid faces comprises two opposite corners having acute angles and two opposite corners having obtuse angles; the two opposite corners having acute angles are joined to the corresponding adjacent rhomboid faces; the tip is formed by the corresponding corners having obtuse angles; the two opposite corners having the acute angles have the same angle, and the two opposite corners having the obtuse angles have the same angle; the obtuse angle is between 108 and 110 degrees, and the acute angle is between 70 and 72 degrees; and
    the plurality of unit body layers are arranged such that the tips are staggered.

2. The casing of claim 1, wherein the shell comprises a bottom plate and a side plate; the side plate is arranged around a periphery of the bottom plate; a thickness of the bottom plate and a height of the side plate are composed of the plurality of unit body layers stacked and staggered.

3. The casing of claim 2, wherein the main portions of the plurality of unit bodies in each unit body layer are arranged in a honeycomb structure, and the unit body layers are arranged such that the tips of adjacent layers are staggered.

4. The casing of claim 3, wherein the unit bodies are aligned such that the tips are aligned perpendicularly relative to the bottom plate; when an external force impacts on the shell, the external force is transmitted among the plurality of unit bodies through the tips and dissipated.

5. The casing of claim 3, wherein the plurality of unit body rows are formed by 3D printing.

* * * * *